(12) United States Patent
Müller

(10) Patent No.: US 8,947,097 B2
(45) Date of Patent: Feb. 3, 2015

(54) DEVICE FOR MEASURING ELECTRICAL CURRENT, VOLTAGE AND TEMPERATURE ON AN ELECTRICAL CONDUCTOR MADE OF RIGID MATERIAL

(75) Inventor: Klaus-Georg Müller, Wilhelmsfeld (DE)

(73) Assignee: ABB Patent GmbH, Ladenburg (DE)

( * ) Notice: Subject to any disclaimer, the term of this patent is extended or adjusted under 35 U.S.C. 154(b) by 84 days.

(21) Appl. No.: 11/660,495

(22) PCT Filed: Aug. 19, 2005

(86) PCT No.: PCT/EP2005/009013
§ 371 (c)(1),
(2), (4) Date: Jan. 25, 2008

(87) PCT Pub. No.: WO2006/021389
PCT Pub. Date: Mar. 2, 2006

(65) Prior Publication Data
US 2008/0246462 A1    Oct. 9, 2008

(30) Foreign Application Priority Data

Aug. 21, 2004 (DE) .......................... 10 2004 040 575

(51) Int. Cl.
| | | |
|---|---|---|
| *G01N 27/416* | (2006.01) | |
| *G01R 15/14* | (2006.01) | |
| *G01R 15/22* | (2006.01) | |
| *G01R 19/32* | (2006.01) | |

(52) U.S. Cl.
CPC ............ *G01R 15/142* (2013.01); *G01R 15/146* (2013.01); *G01R 15/22* (2013.01); *G01R 19/32* (2013.01)

USPC .......... 324/416; 324/522; 324/713; 324/526; 324/525; 439/754; 439/759; 439/762

(58) Field of Classification Search
USPC .................................. 324/126, 127; 361/763
See application file for complete search history.

(56) References Cited

U.S. PATENT DOCUMENTS

| | | | |
|---|---|---|---|
| 2,445,946 A * | 7/1948 | Harper ........................... | 439/759 |
| 3,245,021 A * | 4/1966 | Kernander et al. ............. | 338/49 |
| 3,372,334 A | 3/1968 | Fenoglio et al. | |
| 4,182,982 A | 1/1980 | Wolf et al. | |

(Continued)

FOREIGN PATENT DOCUMENTS

| | | |
|---|---|---|
| DE | 195 10 662 C2 | 10/1996 |
| DE | 199 06 276 A1 | 9/2000 |

(Continued)

*Primary Examiner* — Richard Isla Rodas
(74) *Attorney, Agent, or Firm* — Buchanan Ingersoll & Rooney PC

(57) ABSTRACT

A device for measuring electrical current, voltage and temperature in a conductor made of rigid material is disclosed. The conductor is formed from two conductor sections, between which an electrical resistor element is provided that is made of a material having greater resistance than the material of the conductor sections. In the region of the resistor element, a flattened area with a depression is provided, over which a measuring arrangement, through which a portion of the current flowing through the conductor flows, is placed in the manner of a bridge. In the measuring arrangement is arranged in the vicinity of a contact piece by means of which the conductor can be connected in an electrically conducting manner to another conductor such that the heat generated at the contact point is measured.

21 Claims, 2 Drawing Sheets

(56) References Cited

U.S. PATENT DOCUMENTS

| | | | |
|---|---|---|---|
| 4,524,426 A * | 6/1985 | Eckert et al. | 705/410 |
| 4,973,937 A * | 11/1990 | Weinstein et al. | 338/49 |
| 6,028,426 A | 2/2000 | Cameron et al. | |
| 6,218,805 B1 | 4/2001 | Melcher | |
| 6,240,177 B1 * | 5/2001 | Guntzburger et al. | 379/387.01 |
| 6,409,553 B1 * | 6/2002 | Krause et al. | 439/757 |
| 6,734,665 B2 * | 5/2004 | Jagiella et al. | 324/207.16 |
| 6,787,935 B2 * | 9/2004 | Heim | 307/10.1 |
| 6,940,266 B2 * | 9/2005 | Roden et al. | 324/126 |
| 7,292,022 B2 * | 11/2007 | Hirasawa | 324/126 |
| 7,358,716 B2 * | 4/2008 | Preusse et al. | 324/117 R |
| 2003/0011355 A1 | 1/2003 | Skerritt et al. | |
| 2003/0057770 A1 * | 3/2003 | Heim | 307/9.1 |
| 2003/0222511 A1 | 12/2003 | Hetzler | |
| 2007/0200720 A1 * | 8/2007 | Dreiskemper et al. | 340/636.1 |

FOREIGN PATENT DOCUMENTS

| | | |
|---|---|---|
| DE | 100 00 500 A1 | 7/2001 |
| DE | 100 41 879 A1 | 3/2002 |
| DE | 102 53 018 A1 | 5/2004 |

* cited by examiner

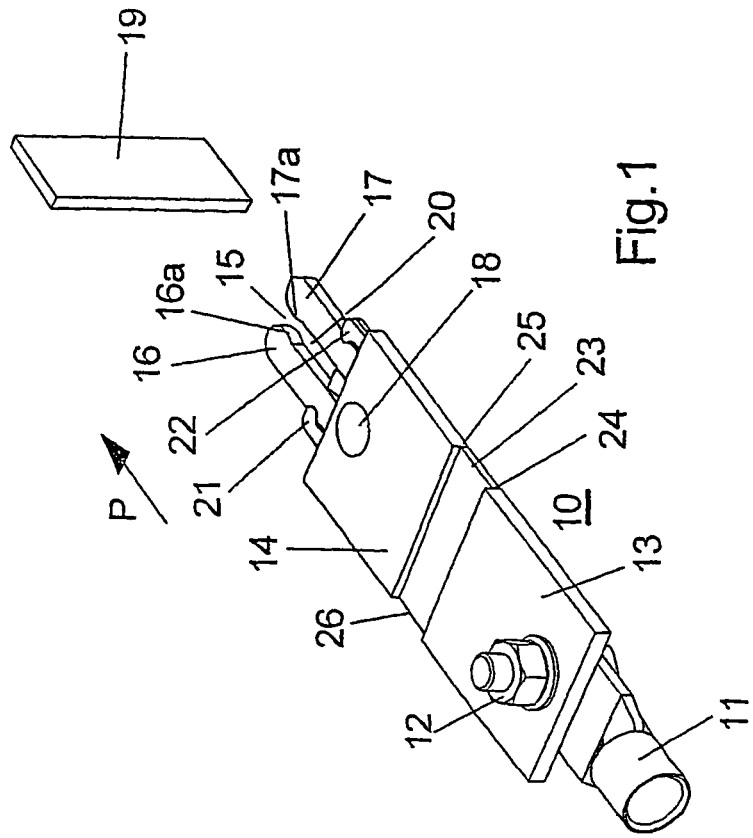
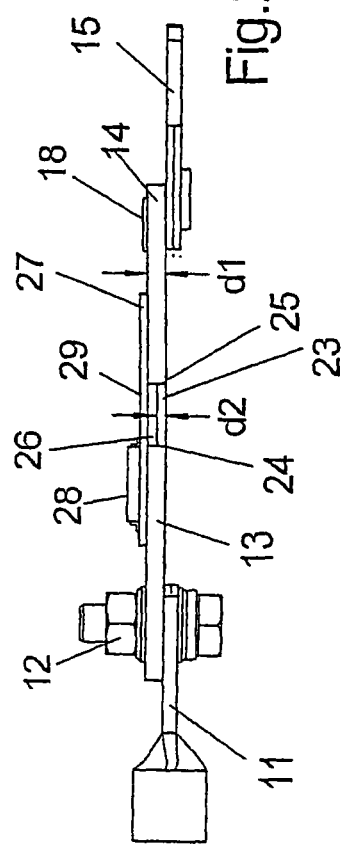
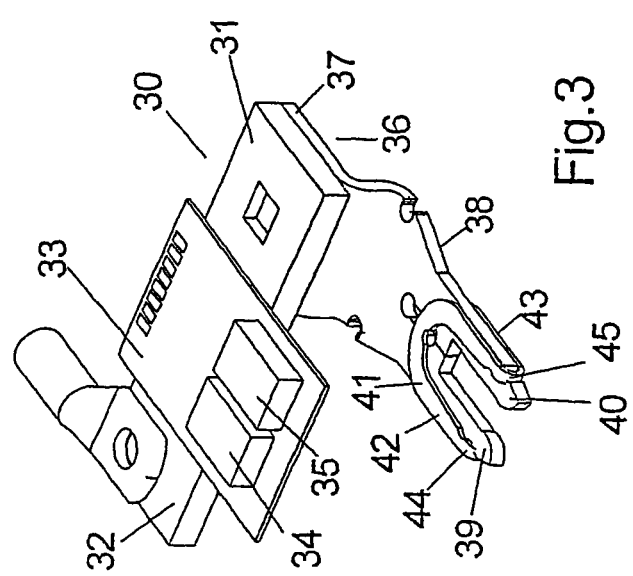
Fig.1
Fig.2
Fig.3

DEVICE FOR MEASURING ELECTRICAL CURRENT, VOLTAGE AND TEMPERATURE ON AN ELECTRICAL CONDUCTOR MADE OF RIGID MATERIAL

The invention relates to a device according to the pre-characterizing clause of claim 1.

Voltage and current measurements in low-voltage switchgear systems are predominantly made using inductive transducers or Hall sensors in order to guarantee the required DC isolation between the measuring and evaluation point. In addition, it is also possible to provide such DC isolation by means of optocouplers, which pass on the signals produced by measuring elements to a processing unit.

Resistor elements can also be used for current measurement or voltage measurement, but these are rarely used on account of the high power loss in the resistor element and the lack of DC isolation.

In a low-voltage switchgear system, busbars supplying the current run horizontally, while perpendicular or vertically running distribution bars are associated with the busbars. The individual control, switching and regulating devices are located in withdrawable trays, contact elements, which surround the distribution bars in the form of a mouth, being provided on the withdrawable trays. In the event of improper maintenance or for other reasons, there is a risk, due to high current densities, of even small deviations in the contact forces leading to a high increase in temperature at these contact points. The consequences can be burnt cables and damage to the system. Because of the high cost of measuring equipment, the temperature of busbar contacts of this kind in low-voltage switchgear systems is not monitored as standard.

The object of the invention is to create a device with which the electrical current, the voltage and the temperature of the contact pieces can be easily measured.

According to the invention, this object is achieved with the characteristics of claim 1.

According to the invention, therefore, the conductor is formed from two conductor sections, between which an electrical resistor element is provided that is made of a material having greater resistance than the material of the conductor, wherein, in the region of the resistor element, a flattened area with a depression is arranged, over which a measuring switchgear arrangement, through which a portion of the current flowing through the conductor flows, is placed in the manner of a bridge, and in that the measuring arrangement is arranged in the vicinity of a contact piece by means of which the conductor can be connected in an electrically conducting manner to another conductor such that the heat generated at the contact point is measured.

In the automobile sector, in 12V/24V battery management, the ASIC IHM-A-1500, which is distinguished by high sensitivity, has been developed by Isabellenhütte for measuring current.

This circuit can be used for measuring current, voltage and temperature in the conductor section, which is in immediate contact with the above-mentioned mouth contact piece or which carries this so that heat generated here can be measured directly by the circuit.

Either a ribbon cable, which has two sections between which the electrical resistor element is located, can be used as a conductor; it is, of course, also possible to use a round wire conductor with a flattened area in the area of which the depression, and therefore also the resistor element, are located.

In this case, the current flows via the resistor element and, in parallel with this, via the measuring circuit.

Here, the resistor element can be made of manganin, which has a resistance which is 20 times as high as that of copper.

Further advantageous embodiments of the invention can be seen from the further dependent claims.

The invention, as well as further advantageous embodiments and improvements of the invention, and further advantages, are explained and described in more detail with reference to the drawing, in which an exemplary embodiment of the invention is shown.

In the drawing

FIG. 1 shows a perspective view of a conductor section

FIG. 2 shows a side view of the conductor sub-section according to FIG. 1 with measuring device ready-fitted, FIG. 3 shows a perspective view of an offset contact piece.

Figure 4:
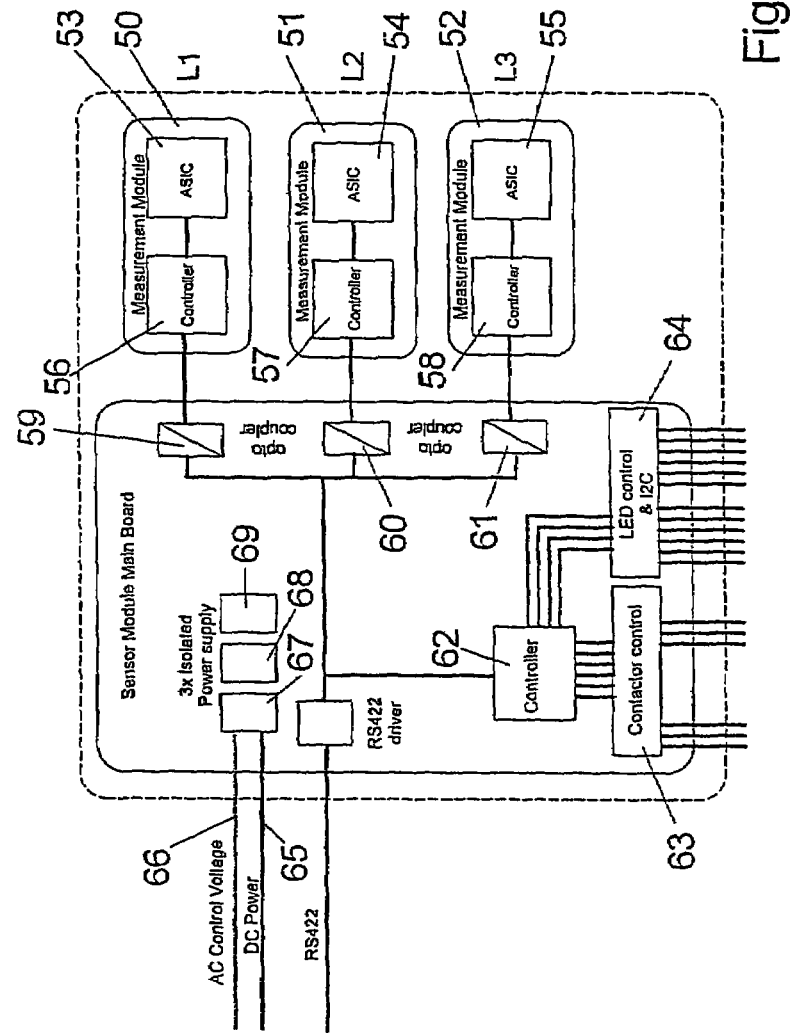
FIG. 4 shows a circuit arrangement for the measuring device.

FIG. 1 shows a perspective representation of a conductor 10, which has at its one end a crimp connector for a connecting conductor, which is connected to the conductor 10 by a screw connection 12. The conductor 10 is made up of a first conductor sub-section 13 to which the crimp connector 11 is fixed, and a second conductor section 14 to which a contact piece 15 with two contact tongues 16 and 17 is connected by means of a rivet connection 18. This contact piece 15 makes contact with a vertically running conductor 19 in that the conductor 10 with the contact piece 15 is pushed over the vertically running ribbon cable 19 so that the ribbon cable 19 is located in the intermediate space 20 between the tongues 16 and 17. The direction of pushing is shown by the arrow P. It should be stated solely for the sake of completeness that inwardly facing projections 16a and 17a, the spacing between which is somewhat less than the thickness of the second conductor 19, are provided on the free ends of the contact tongues 16 and 17. A leg spring (see FIG. 3) with legs 21 and 22, which press the contact tongues 16, 17 towards one another, is provided to increase the contact force of the contact tongues 16 and 17.

A resistor element 23, which is firmly soldered to the two conductor sections 13 and 14 at the contact points 24 and 25, is provided between the first conductor section 13 and the second conductor section 14. In the embodiment shown in FIG. 1, the thickness of the resistor element 23 is less than the thickness of the conductor sections 13 and 14, so that a depression 26 is formed. The resistor element can be made of manganin, for example, which has a resistance value that is 20 times higher than the resistance value of the two conductor sections 13 and 14, which are made of copper.

A printed circuit board 27, on which a measuring circuit 28 is fixed, is soldered on the surface of the two conductor sections 13 and 14 facing the observer. The printed circuit board 27, together with the measuring circuit 28, forms a measuring arrangement for measuring the current and in particular the temperature, said measuring arrangement being known per se as mentioned in the introduction. Because of the reduced thickness d2 of the resistor element 23 compared with the thickness $d_1$ of the two conductor sections 13 and 14, the current flows both via the resistor element and via the measuring arrangement, this not being shown in more detail here. The board 27 is soldered on the sections 13 and 14.

The measuring device or measuring arrangement, which in its totality is allocated reference number 29, is at mains potential, i.e. at a potential up to 1000 V. Digital signals, which, as explained below, are fed to a microprocessor via optocouplers in order to achieve potential isolation here, are produced at the output of this measuring arrangement 29.

Reference is now made to FIG. 3.

Here, a conductor 30 is shown, which is made up of two conductor sections 31 and 32, between which is located a resistor element, which is the same as the resistor element 23, in the same way as in the embodiment according to FIG. 1. Likewise, a depression is provided between these two conductor sections 31 and 32, on which a printed circuit board 33 is soldered in the same way as on the sections 13 and 14. On the printed circuit board itself are two circuits 34 and 35, of which the circuit 34 corresponds to the circuit 28.

It is shown in FIG. 2 that the contact piece 15 is fixed on the side of the sections 13 and 14 that lie opposite the printed circuit board 27. In the same way, a contact piece 36, which is not flat like the contact piece 15 but bent into a Z-shape, is firmly riveted to the conductor section 31 on the side opposite the board 33. One leg 37 is located on the conductor section 31, and the other leg 38 running parallel to this carries contact prongs 39 and 40, which are connected to one another by means of a contact pressure spring 41, which is designed as a U-shaped contact pressure spring, wherein a first U-shape 42 and a U-shape 43 running parallel to this, which are connected to one another by means of connecting elements 44 and 45, are provided, the two U-shapes 42 and 43 being placed over the contact piece, and the spring force of the pair of legs 42, 43 towards one another being applied on the contact tongues 39 and 40 via the connecting sections 44, 45. Such a contact arrangement is also known per se.

FIG. 4 shows a circuit arrangement with a number of printed circuit boards 50, 51 and 52 corresponding to the number of phases, on each of which is mounted an ASIC circuit 53, 54 and 55 corresponding to the circuits 28 and 34, which are connected to a first microprocessor 56, 57 and 58, in which the signals of the circuits 53 to 55 are processed in a first step. The output signals of the microprocessors 56, 57 and 58 are fed via optocouplers 59, 60, 61 to a microprocessor 62, in which the signals of the microprocessors 56 to 58 are processed further.

Control devices 63 for controlling a switching device and for an indication unit 64 are connected to the output of the microprocessor 62. Power is supplied by means of a feed cable 65, to which a line 66 for a control voltage is fed, which ensure and control the energy supply by means of three isolated power supply units 67, 68 and 69.

FIG. 1 shows a conductor 10, which has a crimp receptacle 11 for a connecting conductor at its one end. This crimp connector 11 is connected to a first conductor sub-section 13. Connected to this conductor sub-section 13, for example welded or soldered to its face edge opposite the crimp receptacle 11, is a resistive resistor element 23, to the free face edge of which a contact piece 15, which ends in the shape of a fork with two fork prongs 16 and 17, is connected. Spring elements 21 and 22 press the two fork prongs 16 and 17 against one another. The opening 20 between the two fork prongs 16 and 17 is placed over a vertically running distribution bar 19. The whole conductor arrangement 10 serves to supply current to switching, control and regulating devices within a switchgear system. The distribution bars 19, which run vertically in the switchgear system, are connected to horizontally running busbars, which are not shown in more detail here.

The thickness $D_1$ of the sections 13 and 16 respectively is greater than the thickness $D_2$ of the resistor element 23, so that a depression is formed in the area of the resistor element 23. This depression is covered by an electrical circuit or measuring device 29, wherein the circuit 29 includes a printed circuit board 27 on which measuring elements 28 for electrical current, voltage, and temperature are mounted.

If current now flows through the arrangement 10, then part of the current flows via the resistor element 23 and a further part via the measuring device 29, wherein the current flowing there can be measured. Furthermore, the voltage and the temperature, which can occur in particular due to poor contact transitions and thus high contact resistances between the contact forks 16, 17 and the distribution bar 19, can also be measured.

Connecting conductors are provided on the measuring device 29, which are connected to a microprocessor in which the signals coming from the measuring device 29 can be processed further. An important factor in the use of the measuring device 29, which is known per se, in the low-voltage field up to 1000 V, is the distribution of the current flowing through the resistor element 23 and the measuring device 29.

It must be added that the board is soldered to the sections 13 and 14.

The measuring device is at mains potential, i.e. at a potential of up to 1000 V. Digital signals are produced at the output of the measuring device 29 and are fed to the microprocessor via potential isolators, e.g. optocouplers.

The invention claimed is:

1. A device for measuring electrical current, voltage, and temperature in a low voltage system, comprising:
 a contact piece for connecting to a distribution bar; and
 a conductor made of rigid material, wherein the conductor includes:
 two conductor sections, wherein each conductor section is formed on opposite ends of the conductor;
 an electrical resistor element disposed between the two conductor sections, wherein the electrical resistor is formed of a material having greater resistance than a material of which the two conductor sections are formed;
 an area in a region of the resistor element that is flatter than the two conductor sections and forms a depression between the two conductor sections;
 a measuring arrangement formed over the depression as a bridge between the two conductor sections, the measuring arrangement including at least one measuring device and a microprocessor, wherein the measuring arrangement has a printed circuit board and a measuring circuit and wherein the measuring circuit and a first microprocessor, which processes the signals coming from the measuring circuit are located on the printed circuit board, wherein the output signal of the at least one measuring device is fed to the microprocessor via a respective potential isolator,
 wherein the contact piece is connected to a first of the two conductor sections and includes two contact prongs that are connected to one another via a contact spring, the contact spring having first and second sections formed on opposite sides of the contact piece, and the first and second sections of the contact spring are connected via a connecting element, and
 wherein the contact piece makes contact with a vertically running conductor in that the conductor with the contact piece is pushed over the vertically running conductor, so that the vertically running conductor is located in the intermediate space between the two contact prongs, and
 wherein an arrangement of the conductor supplies current to switching, control, and regulating devices within a switchgear system.

2. An electrical low-voltage system comprising the device as claimed in claim 1.

3. The device as claimed in claim 1, wherein the contact piece is connected to a first end of the conductor and projects outwardly from the first end of the conductor.

4. The device as claimed in claim 3, wherein the contact piece projects outwardly in a lengthwise direction from the conductor.

5. The device as claimed in claim 1, wherein a connector is connected to a second end of the two conductor sections on a second end of the conductor.

6. The device as claimed in 5, wherein the connector projects outwardly from the second end of conductor.

7. The device as claimed in claim 6, wherein the connector projects outwardly in a lengthwise direction.

8. The device as claimed in claim 1, wherein the contact piece includes a first leg connected to the first of the two conductor sections and a second leg that supports the contact prongs.

9. The device as claimed in claim 1, wherein the contact spring is U-shaped.

10. The device as claimed in claim 9, wherein the first and second sections of the contact spring are U-shaped and parallel to each other.

11. The device as claimed in claim 1, wherein the contact spring is configured to apply a spring force on each prong of the contact piece via the connecting section to clamp the contact piece onto the distribution bar.

12. The device as claimed in claim 1, wherein the resistor element is made of manganin.

13. The device as claimed in claim 12, wherein the resistor element is soldered between the two conductor sections, and wherein the thinner area forms a depression between the two conductor sections, over which the measuring arrangement is placed.

14. The device as claimed in claim 13, wherein the measuring device and microprocessor of the measuring arrangement are mounted to a printed circuit board and comprise a measuring circuit.

15. The device as claimed in claim 14, wherein the microprocessor of the measuring arrangement is a first microprocessor, which pre-processes the signals coming from the measuring circuit.

16. The device as claimed in claim 15, wherein the potential isolators are optocouplers provided for DC isolation of the first microprocessor and plural second microprocessors.

17. The device as claimed in claim 1, wherein the resistor element is soldered between the conductor sections, and wherein the flatter area forms a depression between the two conductor sections, over which the measuring arrangement is placed.

18. The device as claimed in claim 1, wherein the at least one measuring device and microprocessor of the measuring arrangement are mounted to a printed circuit board and comprise a measuring circuit.

19. The device as claimed in claim 1, wherein the microprocessor of the measuring arrangement is a first microprocessor, which pre-processes the signals coming from the at least one measuring device, and which is located on a printed circuit board.

20. The device as claimed in claim 1, wherein the microprocessor of the measuring arrangement is a first microprocessor and the potential isolators are optocouplers for DC isolation of the first microprocessor and plural second microprocessors.

21. A device for measuring electrical current, voltage and temperature in a low voltage system, comprising:
   a contact piece for connecting to a distribution bar; and
   a conductor made of rigid material, wherein the conductor includes:
   two conductor sections, wherein each conductor section is formed on opposite ends of the conductor;
   an electrical resistor element disposed between the two conductor sections, wherein the electrical resistor is formed of a material having greater resistance than a material of which the two conductor sections are formed;
   an area in a region of the resistor element that is flatter than the two conductor sections and forms a depression between the two conductor sections;
   a measuring arrangement formed over the depression as a bridge between the two conductor sections, the measuring arrangement including at least one measuring device and a microprocessor, wherein the measuring arrangement has a printed circuit board and a measuring circuit and wherein the measuring circuit and a first microprocessor, which processes the signals coming from the measuring circuit are located on the printed circuit board, wherein the output signal of the at least one measuring device is fed to the microprocessor via a respective potential isolator,
   wherein the contact piece is connected to a first of the two conductor sections and includes two contact prongs that are connected to one another via a contact spring, the contact spring having first and second sections formed on opposite sides of the contact piece, and the first and second sections of the contact spring are connected via a connecting element,
   wherein the contact piece makes contact with a vertically running conductor in that the conductor with the contact piece is pushed over the vertically running conductor, so that the vertically running conductor is located in the intermediate space between the two contact prongs,
   wherein an arrangement of the conductor supplies current to switching, control, and regulating devices within a switchgear system,
   wherein the contact piece includes a first leg connected to the first of the two conductor sections and a second leg that supports the contact piece, and
   wherein the first leg and the second leg of the contact piece form a Z-shape.

\* \* \* \* \*